United States Patent
Omori et al.

(10) Patent No.: US 6,955,993 B2
(45) Date of Patent: Oct. 18, 2005

(54) MASK AND METHOD FOR MAKING THE SAME, AND METHOD FOR MAKING SEMICONDUCTOR DEVICE

(75) Inventors: Shinji Omori, Kanagawa (JP); Shigeru Moriya, Kanagawa (JP)

(73) Assignee: Sony Corporation, Tokyo (JP)

( * ) Notice: Subject to any disclaimer, the term of this patent is extended or adjusted under 35 U.S.C. 154(b) by 35 days.

(21) Appl. No.: 10/467,123

(22) PCT Filed: Dec. 4, 2002

(86) PCT No.: PCT/JP02/12689

§ 371 (c)(1),
(2), (4) Date: Aug. 4, 2003

(87) PCT Pub. No.: WO03/052803

PCT Pub. Date: Jun. 26, 2003

(65) Prior Publication Data

US 2004/0217435 A1 Nov. 4, 2004

(30) Foreign Application Priority Data

Dec. 4, 2001 (JP) ........................ 2001-370600

(51) Int. Cl.⁷ ............................................ H01L 21/302
(52) U.S. Cl. .................. 438/736; 438/708; 438/942; 430/5; 430/312
(58) Field of Search ................. 716/19, 21; 216/41, 216/45; 430/5, 30, 312, 313; 438/736, 708, 942

(56) References Cited

U.S. PATENT DOCUMENTS

| | | | |
|---|---|---|---|
| 5,849,437 A | 12/1998 | Yamazaki et al. | |
| 6,376,137 B1 | 4/2002 | Okino | |
| 2001/0046631 A1 | 11/2001 | Fujiwara et al. | |

FOREIGN PATENT DOCUMENTS

| | | |
|---|---|---|
| JP | 61-283121 | 12/1986 |
| JP | 7-312341 | 11/1995 |
| JP | 8-202018 | 8/1996 |
| JP | 2001-332468 | 5/2000 |
| JP | 2000-323372 | 11/2000 |
| JP | 2000-357647 | 12/2000 |
| JP | 2001-052989 | 2/2001 |
| JP | 2003-059819 | 2/2003 |

*Primary Examiner*—Hsien-Ming Lee
(74) *Attorney, Agent, or Firm*—Robert J. Depke; Trexler, Bushnell, Blackstone, Giangiorgi & Marr

(57) ABSTRACT

A mask capable of alignment by the TTR system and complementary division and having a high strength, a method of production of the same, and a method of production of a semiconductor device having a high pattern accuracy are provided. A stencil mask having stripe-shaped grid lines 4 formed by etching a silicon wafer in four sub-regions A to D on a membrane, having the stripes arranged point symmetrically about a center of the membrane, and having all of the grid lines connected to other grid lines or the silicon wafer around the membrane (support frame), a method of production of the same, and a method of production of a semiconductor device using the mask.

16 Claims, 14 Drawing Sheets

MASK AND METHOD FOR MAKING THE SAME, AND METHOD FOR MAKING SEMICONDUCTOR DEVICE

This application claims priority to Japanese Patent Application No. JP2001-370600, filed Dec. 4, 2001, which is incorporated herein by reference.

TECHNICAL FIELD

The present invention relates to a mask used for production of a semiconductor device and a method of production of the same and a method of production of a semiconductor device.

BACKGROUND ART

Low energy electron beam proximity projection lithography (LEEPL) is one of the next generation exposure techniques taking the place of photolithography. LEEPL uses a stencil mask having a membrane of several hundreds of nm thickness formed with holes corresponding to device patterns. A "stencil mask" means a mask formed with holes passing through its membrane. No material exists in the spaces in the holes of the stencil mask.

In LEEPL, the mask is arranged just above a wafer so as to make a distance between the mask and wafer several tens of μm or so. Pattern parts of the mask are scanned by an electron beam of several keV to transfer the patterns on the wafer (T. Utsumi, *Journal of Vacuum Science and Technology*, B17, 2897 (1999)).

However, the mask for LEEPL has a problem of distortion of the patterns due to internal stress when the membrane is made larger in size and the membrane flexes by its weight. One method to solve the problem is to use diamond or another material having a high Young's modulus as the membrane material (see Japanese Unexamined Patent Publication (Kokai) No. 2001-77016). For decreasing the flex of the membrane due to its weight, the internal stress of the membrane has to be increased along with increase of the membrane size. Therefore, enlargement of the membrane is limited by itself.

Another method is the method of supporting a sub-sectioned membrane by a grid line (strut) structure. This is employed in masks used for SCALPEL (scattering with angular limitation in projection electron-beam lithography), PREVAIL (projection exposure with variable axis immersion lenses), and an EB stepper (for example, L. R. Harriott, *Journal of Vacuum Science and Technology*, B 15, 2130 (1997); H. C. Pfeiffer, *Japanese Journal of Applied Physics*, 34, 6658 (1995)).

FIG. 1 is a schematic view of an EB stepper mask currently proposed. As shown in FIG. 1, grid lines 11 divide and support a membrane 12. The membrane 12 is provided with holes (not shown) in device patterns.

The mask shown in FIG. 1 is made from for example an SOI (silicon on insulator or semiconductor on insulator) wafer comprised of a silicon wafer formed with a silicon active layer via a silicon oxide film. The silicon active layer on the surface of the SOI wafer is used as the membrane 12, while the grid lines 11 are formed by etching the silicon wafer from the rear surface of the silicon active layer.

According to the mask structure shown in FIG. 1, the membrane 12 is divided into small sections which are supported by the stiff grid lines 11. Therefore, the problem of the increase in deflection of the membrane along with the increase in the membrane size as observed in the mask described in Japanese Unexamined Patent Publication (Kokai) No. 2001-77016 etc. does not occur.

However, the mask structure with the grid lines 11 formed regularly in a square mesh as shown in FIG. 1 cannot be applied as it is to LEEPL. In LEEPL, first, a mask region corresponding to one or more chips is scanned by an electron beam.

After the exposure is finished, a wafer stage is moved by exactly a distance corresponding to the chip size or a whole multiple of the same and exposure performed again. This is repeated to expose chips arranged over the entire surface of the wafer (step and repeat exposure). As shown in FIG. 1, when the grid lines 11 are arranged in a square mesh, regions right below the grid lines cannot be exposed.

Therefore, rather than dividing the entire mask region uniformly in a mesh, the method of dividing the membrane of the mask 21 into four sub-regions A to D as shown in FIG. 2 and forming the grid lines (see FIG. 1) by these regions so that the meshes are offset may be considered. Here, each of the sub-regions A to D is a mask region corresponding to one or more chips (chip transfer region). The wafer stage is moved in units of these sub-regions.

FIG. 3 shows an example of arrangement of the grid lines 11 on the sub-regions A to D of the membrane of FIG. 2. In FIG. 3, the regions divided by the orthogonal x-axis and y-axis correspond to the sub-regions A to D of FIG. 2. As shown in FIG. 3, for convenience, the sub-regions are assumed to be squares of 10×10 blocks obtained by dividing them in a mesh.

In the example shown in FIG. 3, the 5×5 block parts surrounded by dotted lines in the sub-regions A to D correspond to single chips. When moving the wafer stage to the sub-regions A to D, the parts surrounded by the dotted lines are multiply exposed. The arrangement of the grid lines 11 in these sub-regions is a repetition of the arrangement of the grid lines 11 in the portions surrounded by the dotted lines (transfer regions).

As described above, since the regions right below the grid lines cannot be exposed, if linking the 5×5 blocks surrounded by the dotted lines with a 5 row×5 column table and summarizing which sub-region is exposed at each block (namely, in which sub-region a pattern can be formed), the result is shown in Table 1.

TABLE 1

| A   D | A B   | A B   D | B   D | A B   D |
|-------|-------|---------|-------|---------|
| A   C | A B C | A B C   | B C   | A B     |
| A C D | A B C | A B C D | B C D | A B   D |
|   C D |   B C |   B C D | B C D |   B   D |
| A C D | A   C | A   C D |   C D | A     D |

In the case of a stencil mask, if forming a for example donut-like pattern, the center part surrounded by the pattern cannot be supported. Alternatively, when forming a long pattern etc. in one direction etc., the membrane will warp and the positional accuracy of the pattern will become lower. Therefore, the pattern is divided and a plurality of complementary masks are formed. The complementary masks are used for multiple exposure to transfer the pattern complementarily (complementary division).

Here, the "complementary masks" mean a plurality of masks formed with different patterns (complementarily divided patterns) comprised of parts of patterns obtained by dividing the pattern of a certain region. By exposing specific regions of the complementary masks superposed at the same place of the exposed object (usually a wafer), the pattern before division is restored and transferred to the exposed object.

For example, when arranging the grid lines shown in FIG. 3, as shown in Table 1, it is possible to form patterns in at least two sub-regions for each block. Therefore, it is possible to link two or more sub-regions with any position of a chip. By multiple exposure superposing four sub-regions on the same mask, it is possible to transfer any device pattern including a donut-like pattern to the wafer.

However, when combining the masks arranged with the grid lines as shown in FIG. 3 with certain types of alignment methods, problems may arise. With LEEPL, the mask and wafer are in proximity at a distance of several tens of $\mu$m, so an alignment optical system cannot be placed between the mask and the wafer.

Consequently, the through-the-reticle (TTR) alignment system as shown in FIG. 4 (Japanese Patent No. 3101582) is used. As shown in FIG. 4, the surface of the wafer 31 is formed with wafer-side alignment marks 32. On the other hand, the mask 33 is also formed with mask-side alignment marks 34. The mask-side alignment marks 34 can be either apertures passing through the membrane or recesses formed only in the surface of the membrane.

Alignment light strikes the wafer-side alignment marks 32 and the mask-side alignment marks 34. Light $L_W$ reflected from the wafer-side alignment marks 32 and Light $L_M$ reflected from the mask-side alignment marks 34 are detected. The relative position of the light $L_W$ and the light $L_M$ is used for alignment of the mask 33 and the wafer 31.

By arranging four alignment detection system ($X_1$, $X_2$, $Y_1$, $Y_2$) at the four corners of the mask as shown in FIG. 5 and performing alignment as shown in FIG. 4, distortion of the mask regions corresponding to the chips can be completely determined. According to the TTR alignment system, the alignment optical system is not placed between the mask and the wafer, so it becomes possible to constantly detect the alignment marks even during electron beam exposure and compensate for chip distortion in real time.

When forming grid lines on a mask in a square mesh as shown in FIG. 1 or FIG. 3, if performing alignment by the TTR alignment system, alignment becomes impossible under specific conditions. FIG. 6 is a cross-sectional view showing one of pattern formation regions surrounded by the grid lines 11.

As shown in FIG. 6, when a detection angle $\theta$ of alignment light L measured from a mask normal line direction z exceeds a specific critical angle $\theta a$ determined by the interval and height of the grid lines 11 and positions of the alignment marks 34, the grid lines 11 and the alignment light L (light reflected from the mask-side alignment marks 34) interfere so the alignment light L can no longer be detected.

DISCLOSURE OF THE INVENTION

The present invention was made in consideration of the above problems and has as its object the provision of a mask able to perform alignment by the TTR system and transfer complementarily divided patterns and having a sufficient membrane strength and a method of production of the same.

Further, the present invention has as its object the provision of a method of production of a semiconductor device improving the alignment accuracy in a lithography step and able to transfer a fine pattern with a high accuracy.

To achieve the above objects, the mask of the present invention is characterized by comprising a support frame; a thin film made formed thinner than said support frame and surrounded by said support frame; a first sub-region of a plurality of sub-regions obtained by dividing said thin film by a plurality of lines including a first line passing through a reference point consisting of one point on said thin film and extending in a first direction and a second line orthogonal to the first line at the reference point and extending in a second direction; a second sub-region adjacent to said first sub-region in the first direction; a third sub-region adjacent to said first sub-region in the second direction; a fourth sub-region adjacent to said second sub-region in the second direction and adjacent to said third sub-region in the first direction; a first group of grid lines comprised of at least one grid line extending on said first sub-region in a second direction and having one end connected to one of a third group of grid lines to reinforce said thin film, said first group of grid lines including a grid line contacting the second line; a second group of grid lines comprised of at least one grid line extending on said second sub-region in the first direction and having one end connected to one of said first group of grid lines to reinforce said thin film, said second group of grid lines including a grid line contacting the first line; said third group of grid lines comprised of at least one grid line extending on said third sub-region in the first direction and having one end connected to one of a fourth group of grid lines to reinforce said thin film, said third group of grid lines including a grid line contacting the first line; said fourth group of grid lines comprised of at least one grid line extending on said fourth sub-region in the second direction and having one end connected to one of said second group of grid lines to reinforce said thin film, said fourth group of grid lines including a grid line contacting the second line; a first aperture formed at a part of a portion other than the grid lines in the first sub-region; and a second aperture formed at a part of a portion other than the grid lines in at least one sub-region of the second to fourth sub-regions.

Preferably, the first aperture and the second aperture form patterns complementarily. Preferably, the grid lines are formed at equal intervals in each of the sub-regions and the first to fourth sub-regions are squares or rectangles the same as each other in shape and size. Further, preferably the grid lines of at least one of group among the first to fourth groups are formed to having other ends connected to the support frame. Preferably, the first and second apertures are holes through which a charged particle beam passes. Preferably, the first to fourth sub-regions are divided into a plurality of chip transfer regions the same in shape and size by at least one first division line parallel to the first line and at least one second division line parallel to the second line. Preferably, the mask has an alignment mark formed at a part of a portion other than the grid lines in the first to fourth sub-regions. Preferably, the alignment mark is formed at a furthest part from the reference point.

Due to this, the problem of the grid lines blocking the alignment light so alignment becoming impossible when aligning the photosensitive surface and the mask by the TTR system is solved. Therefore, it becomes possible to transfer fine patterns with a high accuracy by for example LEEPL.

Further, to achieve the above objects, the method of production of a mask of the present invention is characterized by comprising the steps of forming a support frame around a thin film, forming grid lines reinforcing said thin film at a part on one surface of said thin film, and forming apertures in the thin film at portions other than the grid lines, wherein said step of forming the grid lines comprising the step of forming a first group of grid lines in a first sub-region of said thin film, forming a second group of grid lines in a second sub-region of said thin film, forming a third group of grid lines in a third sub-region of said thin film, and forming a fourth group of grid lines in a fourth sub-region of said thin film; said first sub-region is one of a plurality of sub-regions obtained by dividing said thin film by a plurality of lines including a first line passing through a reference point consisting of one point on said thin film and extending in a first direction and a second line orthogonal to the first line at the reference point and extending in a second direction; said second sub-region is a sub-region adjacent to said first sub-region in the first direction, said third sub-region is a sub-region adjacent to said first sub-region in the second direction, said fourth sub-region is a sub-region adjacent to said second sub-region in the second direction and adjacent to said third sub-region in the first direction, said first group of grid lines is comprised of at least one grid line extending on the first sub-region in the second direction and having one end connected to one of a third group of grid lines to reinforce the thin film and including a grid line contacting the second line, said second group of grid lines is comprised of at least one grid line extending on the second sub-region in the first direction and having one end connected to one of the first group of grid lines to reinforce the thin film and includes a grid line contacting the first line, said third group of grid lines is comprised of at least one grid line extending on the third sub-region in the first direction and having one end connected to one of a fourth group of grid lines to reinforce the thin film and includes a grid line contacting the first line, said fourth group of grid lines is comprised of at least one grid line extending on the fourth sub-region in the second direction and having one end connected to one of the second group of grid lines to reinforce the thin film and includes a grid line contacting the second line, and the step of forming the apertures comprises forming a first aperture at a part of a portion other than the grid lines in the first sub-region and forming a second aperture at a part of a portion other than the grid lines in at least one sub-region of the second to fourth sub-regions.

Due to this, it becomes possible to produce a mask in which an alignment light is not blocked by grid lines when aligning the photosensitive surface and the mask by the TTR system. According to the method of production of a mask of the present invention, it becomes possible to produce a mask able to transfer fine patterns with a high accuracy.

Further, to achieve the above objects, the method of production of a semiconductor device of the present invention comprises an exposure step of irradiating a charged particle beam, radiation, or a light ray on a photosensitive surface via a mask, comprising a first exposure step of irradiating a charged particle beam, radiation, or a light ray on a photosensitive surface via a mask comprising a support frame, a thin film made formed thinner than said support frame and surrounded by said support frame, a first sub-region of a plurality of sub-regions obtained by dividing said thin film by a plurality of lines including a first line passing through a reference point consisting of one point on said thin film and extending in a first direction and a second line orthogonal to the first line at the reference point and extending in a second direction, a second sub-region adjacent to said first sub-region in the first direction, a third sub-region adjacent to said first sub-region in the second direction, a fourth sub-region adjacent to said second sub-region in the second direction and adjacent to said third sub-region in the first direction, a first group of grid lines comprised of at least one grid line extending on said first sub-region in a second direction and having one end connected to one of a third group of grid lines to reinforce said thin film, said first group of grid lines including a grid line contacting the second line, a second group of grid lines comprised of at least one grid line extending on said second sub-region in a first direction and having one end connected to one of said first group of grid lines to reinforce said thin film, said second group of grid lines including a grid line contacting the first line, said third group of grid lines comprised of at least one grid line extending on said third sub-region in the first direction and having one end connected to one of a fourth group of grid lines to reinforce said thin film, said third group of grid lines including a grid line contacting the first line, said fourth group of grid lines comprised of at least one grid line extending on said fourth sub-region in a second direction and having one end connected to one of said second group of grid lines to reinforce said thin film, said fourth group of grid lines including a grid line contacting the second line, a first aperture formed at a part of a portion other than the grid lines in the first sub-region, and a second aperture formed at a part of a portion other than the grid lines in at least one sub-region of the second to fourth sub-regions, said first exposure step conducting the first exposure superposing the first sub-region at a predetermined position of the photosensitive surface to transfer the first aperture in the predetermined position, and a second exposure step of performing second exposure superposing one of the sub-regions including the second aperture to a predetermined position to transfer the second aperture in the predetermined position.

Preferably, said mask comprises a mask-side alignment mark at a part of a portion other than the grid lines in the first to fourth sub-regions and said method further comprises, before said first exposure step, forming in advance a wafer-side alignment mark detectable via the mask on said photosensitive surface or beneath said photosensitive surface and comprises, before each exposure step, at least one of the steps of irradiating light in the first direction to a sub-region including said grid lines extending in the first direction so as to detect positions of light reflected from the mask-side alignment mark and light reflected from the photosensitive surface-side alignment mark to align the mask and the photosensitive surface and irradiating light in the second direction to a sub-region including said grid lines extending in the second direction so as to detect positions of light reflected from the mask-side alignment mark and light reflected from the photosensitive surface-side alignment mark to align the mask and the photosensitive surface. Preferably, the alignment is conducted concurrently with the exposure.

Due to this, it becomes possible to align the photosensitive surface and the mask by the TTR system in the lithography step. According to the present invention, the alignment light is not blocked by grid lines of the mask, so alignment can be performed with a high accuracy.

BRIEF DESCRIPTION OF THE DRAWINGS

FIG. 9A is an enlarged view of the portion of the membrane 3 of FIG. 7, while

BEST MODE FOR CARRYING OUT THE INVENTION

Below, embodiments of a mask and a method of production thereof and a method of production of a semiconductor device of the present invention will be described with reference to the accompanying drawings.

Figure 7:
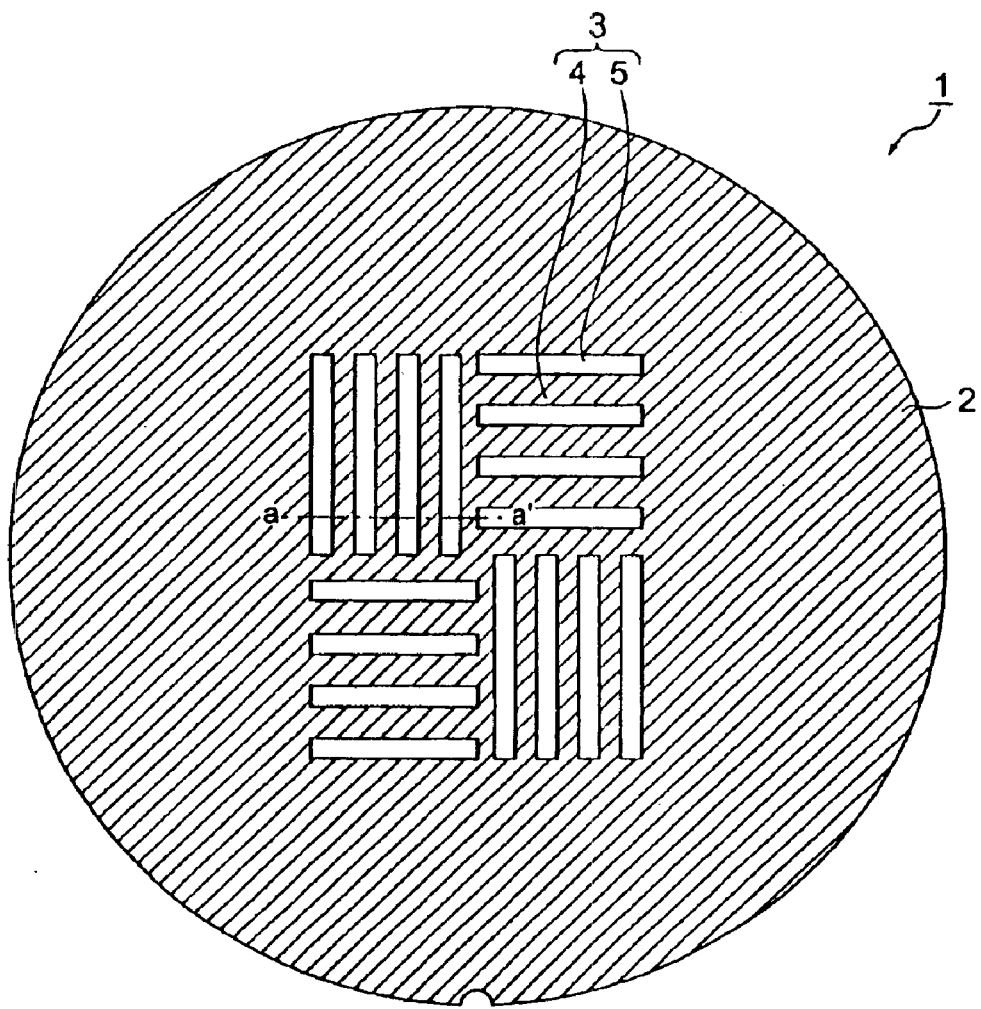
FIG. 7 is a top view of a mask of the present invention.

FIG. 7 is a top view of a mask of the present embodiment. The mask of the present embodiment is preferably used for LEEPL. As shown in FIG. 7, a stencil mask 1 is formed by using for example a silicon wafer 2 formed in its center part with a membrane 3. The stencil mask is a mask formed with holes passing through its membrane. No material exists in a space in the holes of the stencil mask.

The silicon wafer 2 at the circumference of the membrane 3 is used as a support frame reinforcing the strength of the membrane 3. The membrane 3 includes grid lines (struts) 4 integrated with the surrounding silicon wafer 2 and pattern formation regions 5 surrounded by the grid lines 4. The grid lines 4 are comprised of protruding parts formed in bar shapes or line shapes on the membrane 3. The membrane 3 substantially becomes thicker at parts formed with the grid lines 4. Due to this, the membrane 3 is reinforced and deflection of the membrane 3 due to its weight is prevented. The material of the grid lines 4 does not necessarily have to be same as the material of the support frame, but the support frame and the grid lines 4 can be formed easily in the same step by dry etching the silicon wafer 2. In this case, the materials become the same.

Figure 8:
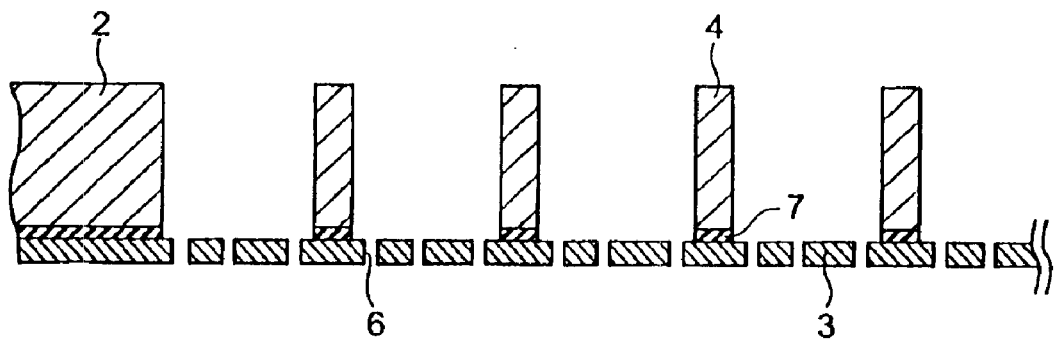
FIG. 8 is a cross-sectional view along a–a' of FIG. 7.

FIG. 8 is a cross-sectional view along a–a' of FIG. 7. As shown in FIG. 8, a pattern formation region of the membrane 3 surrounded by the grid lines 4 is formed with holes 6 corresponding to the device patterns. Also, parts of the pattern formation region are formed with mask-side alignment marks.

The stencil mask of the present embodiment shown in FIG. 7 and FIG. 8 is formed by using a for example SOI wafer comprised of a silicon wafer 2 formed with a silicon layer (membrane 3) via a silicon oxide film 7.

The silicon wafer 2 is etched from a rear surface of the membrane 3 to form the grid lines 4. The silicon oxide film 7 is used as an etching stopper layer in etching of the silicon wafer 2. The holes 6 are formed by etching the membrane 3.

Also, the stencil mask can be formed by a method other than the above method.

The stencil mask of the present embodiment satisfies the following three conditions. The first condition is that the membrane be supported by the grid lines. The second condition is that complementarily divided patterns can be exposed efficiently by step-and-repeat exposure of whole multiples of the chip size. The third condition is that the optical path of the alignment optical system for detecting the alignment marks on the wafer via the membrane not interfere with the grid lines.

Figure 1:
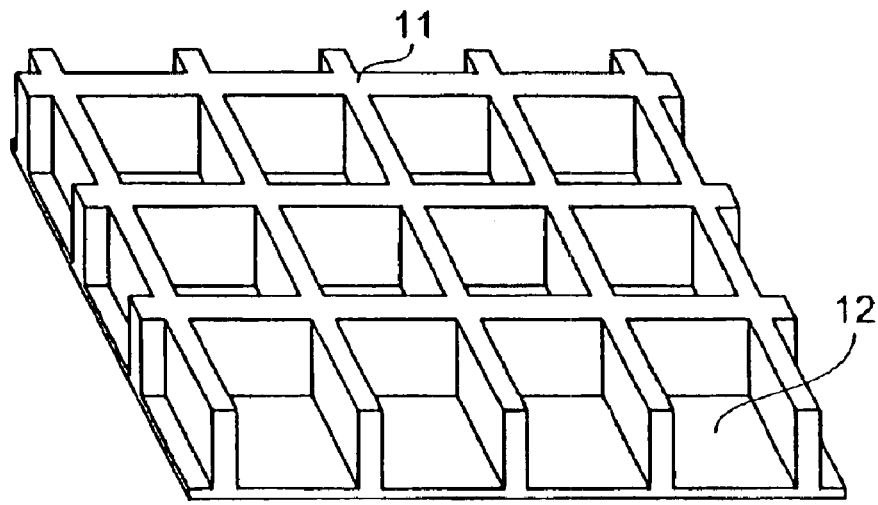
FIG. 1 is a perspective view of a conventional mask.
Figure 2:
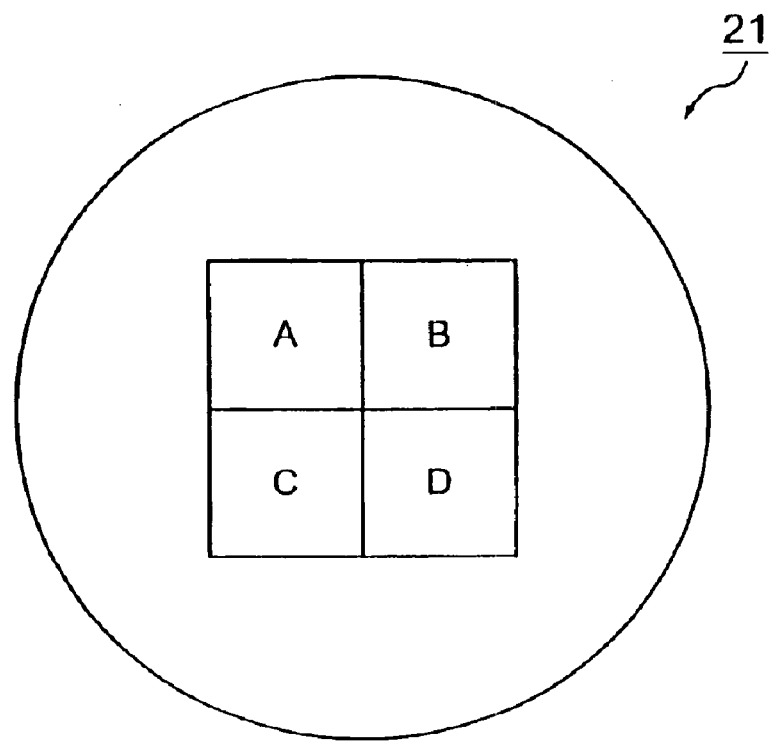
FIG. 2 is an example of dividing a membrane of a mask into a plurality of sub-regions.
Figure 6:
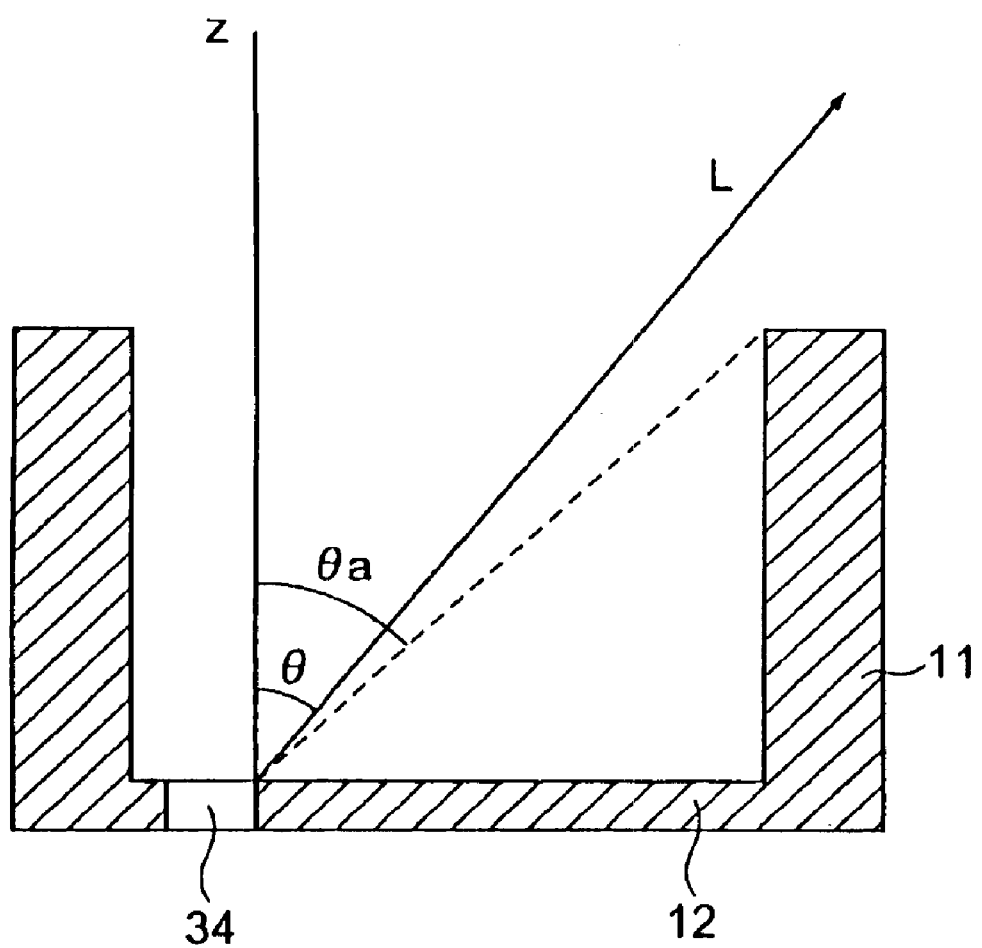
FIG. 6 is a schematic view of alignment using a conventional mask.

In the case of the above mask structure shown in FIG. 1, the first condition is satisfied. However, when dividing the membrane of the structure shown in FIG. 1 into four sub-regions as shown in FIG. 2, positions formed with grid lines are superposed at the four sub-regions. Therefore, the complementarily divided patterns cannot be formed in the four sub-regions A to D, so the second condition is not satisfied. Also, as shown in FIG. 6, the third condition is not satisfied.

Figure 3:
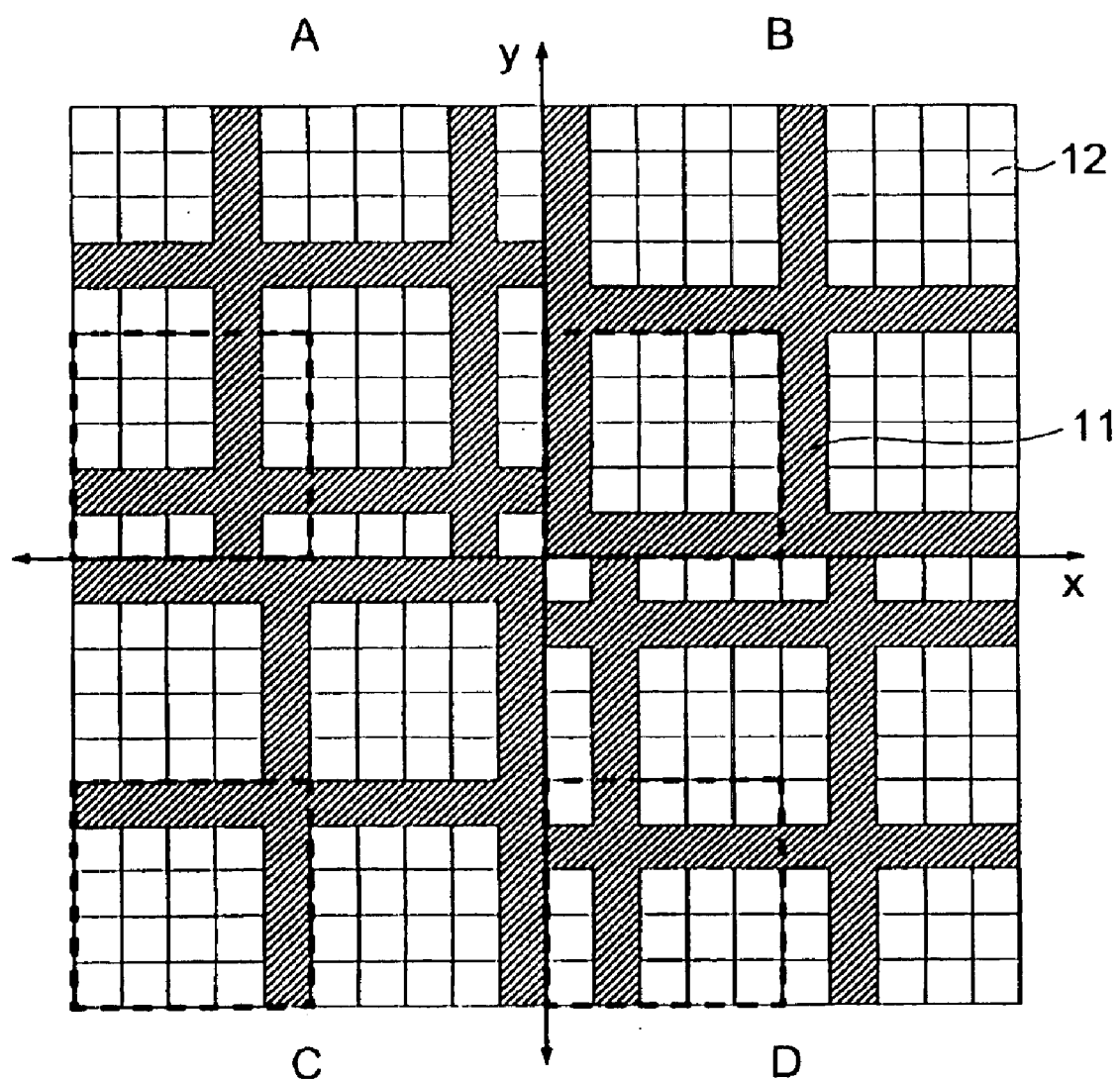
FIG. 3 is an example showing a grid lines arrangement of a mask.
Figure 4:
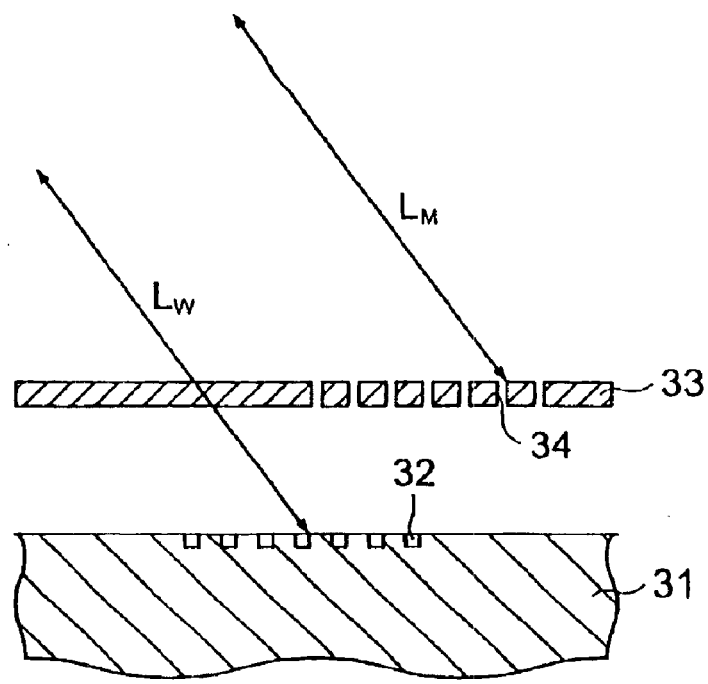
FIG. 4 is a schematic view of a TTR alignment system.
Figure 5:
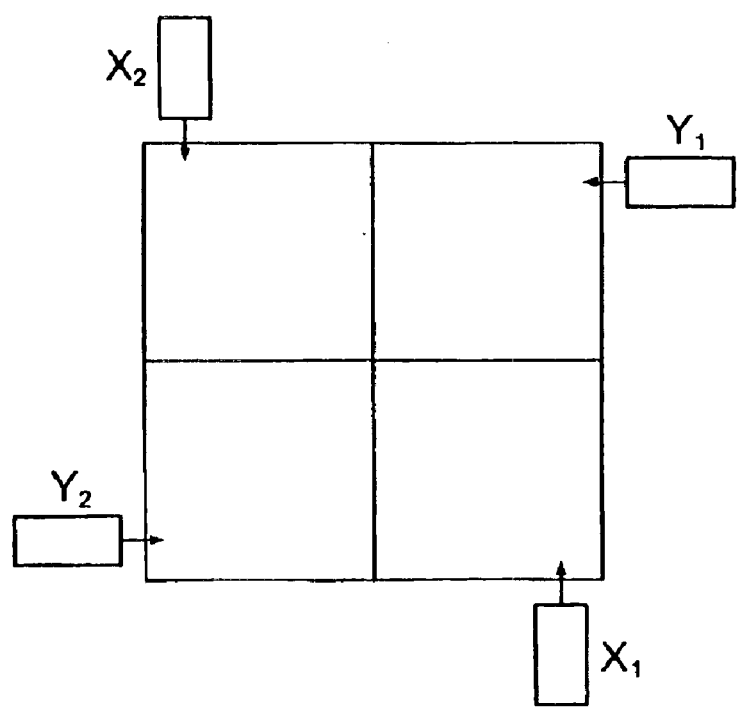
FIG. 5 is a plane view of an example of arrangement of an alignment optical system.

When using the mask structure shown in FIG. 3, the first and the second conditions are satisfied. However, as shown in FIG. 6, the third condition is not satisfied.

Figure 9A:
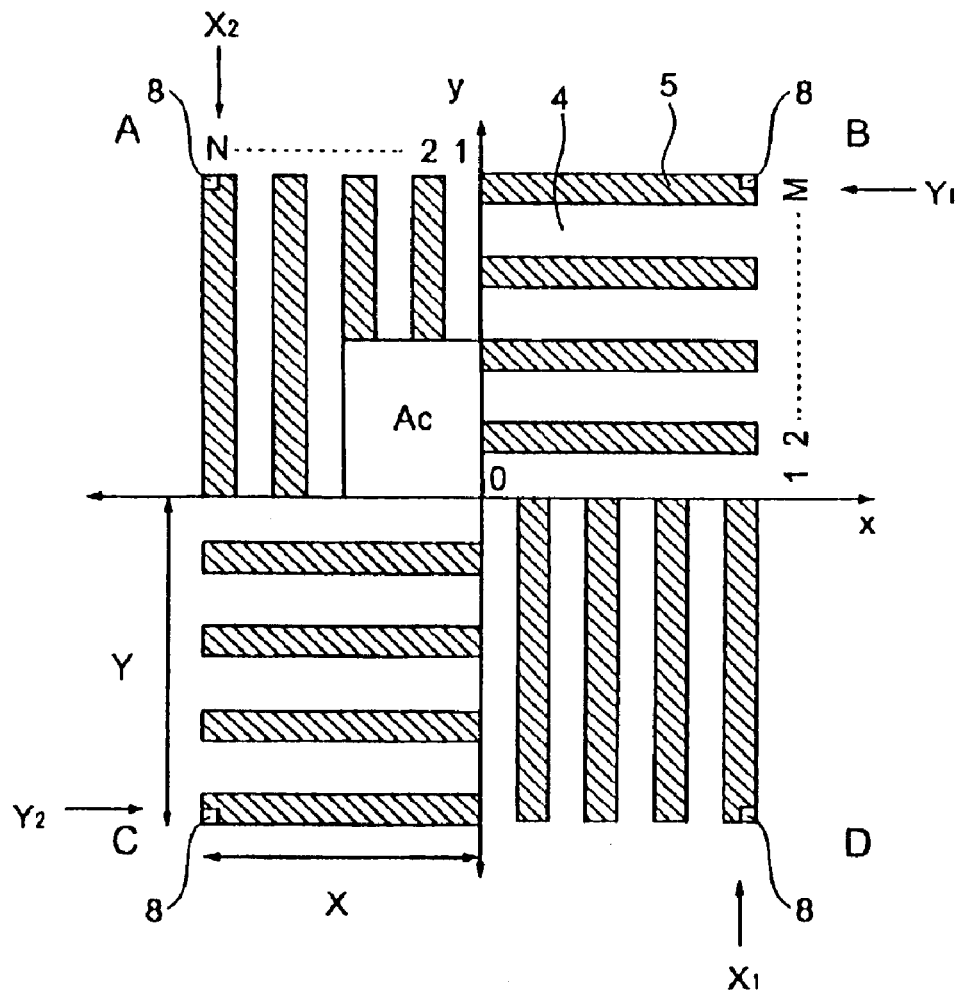

FIG. 9A shows enlarged the arrangement of grid lines at a stencil mask of the present embodiment. The hatched parts of FIG. 9A show the pattern formation regions 5 of FIG. 7, while portions sandwiched between the pattern formation regions 5 show the grid lines 4. An exposure region is divided into four sub-regions A to D by an x-axis and a y-axis. In the sub-regions A and D located on a diagonal, the grid lines 4 are arranged symmetrically with respect to the origin O. The grid lines 4 in the sub-regions A and D extend in the x-direction (first direction). In the same manner, in the sub-regions B and C, the grid lines 4 are arranged symmetrically with respect to the origin O. The grid lines 4 in the sub-regions B and C extend in the y-direction (second direction).

The mask is divided into four sub-regions for the following reasons. A mask having no grid lines is large in deflection of the membrane due to its weight so as to displace the pattern and difficult to be used as a mask. Consequently, it becomes necessary to form grid lines on the membrane. However, when forming grid lines, it becomes necessary to secure regions for forming patterns which had been originally arranged at grid line portions at other positions on the mask. Due to this, at least two regions become necessary on the mask.

Further, since the stencil mask is premised on complementary division, as described above, two or more regions are required for one pattern. Namely, in a stencil mask having grid lines, from the points of view of securing the regions for forming the patterns overlapped with the grid lines and necessity of complementary division, at least 2×2=4 sub-regions become necessary. Therefore, the stencil mask of the present embodiment is divided into four sub-regions.

The mask is divided into four sub-regions and given the grid lines 4 in the x-direction or the y-direction not only to solve the problem of the alignment light being blocked by the grid lines 4 in alignment by the TTR system, but also to evenly arrange the grid lines 4 and thereby suppress distortion of the entire mask.

Also, in each sub-region, the grid lines 4 extend in only one direction so as to form stripes, so, for example, as shown in FIG. 3, compared to the case where the grid lines are arranged in a mesh and the mesh positions are offset from each other in four sub-regions, the grid lines 4 and the other regions (pattern formation regions 5) can be divided more simply.

As shown in FIG. 9A, at each sub-region, the parts of the grid lines 4 and the stripe-shaped pattern formation regions 5 are alternately arranged. The total of the number of parts of the grid lines 4 and the number of the pattern formation regions 5 (N in the sub-regions A and D, while M in the sub-regions B and C) is an even number. The size of each sub-region determined by X and Y of FIG. 9A is a whole multiple of the size of the chip transfer region Ac shown in the sub-region A. Namely, each sub-region includes one or more chip transfer regions Ac.

Figure 9B:
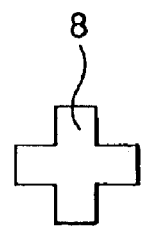
FIG. 9B and FIG. 9C are views of examples of mask-side alignment marks.
Figure 9C:
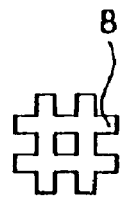

Each sub-region is provided with mask-side alignment marks 8 at portions corresponding to the four corners of the exposure region. FIG. 9B and FIG. 9C are examples of the mask-side alignment marks 8, but the mask-side alignment marks 8 are not limited to these shapes. Also, the mask-side alignment marks 8 can be either apertures passing through the membrane or recesses formed only in the surface of the membrane.

The width of the grid lines 4 and the width of the pattern formation regions 5 are not necessarily the same, but the totals must be a whole fraction of the length of one side of the chip transfer region Ac and the width of the grid lines 4 must be sufficient for supporting the membrane. The four corners of the exposure region are provided with alignment optical systems $X_1$, $X_2$, $Y_1$, $Y_2$.

Also, the width of the grid lines 4 extending in the x-direction (grid lines 4 in the sub-regions B and C) and the width of the grid lines 4 extending in the y-direction (grid lines 4 in the sub-regions A and D) are not necessarily the same. In the same manner, the width of the pattern formation regions 5 extending in the x-direction (pattern formation regions 5 in the sub-regions B and C) and the width of the pattern formation regions 5 extending in the y-direction (pattern formation regions 5 in the sub-regions A and D) are not necessarily the same.

Unlike the mask shown in FIG. 1 or FIG. 3, in the stencil mask of the present embodiment, the membrane at portions surrounded by grid lines is rectangular in shape. This structure easily gives the impression of being disadvantageous in strength at first glance, but this is mistaken. The grid line structure of the present embodiment is based on the theory of material dynamics that "the maximum bending moment acting on a rectangular membrane is proportional to the square of the short side".

The bending moment acting on the membrane fixed at its periphery become maximum value $M=c(b/a) \times a^2$ at a median point of the long side. Here, $a$ is the length of the short side of the rectangle, while $b$ is the length of the long side of the rectangle. Although the proportional coefficient $c$ is a function of the ratio b/a, its dependency on the ratio b/a is weak, so it can be regarded as a constant. These are described in the famous textbook on material dynamics, *Theory of Plates and Shells* (S. P. Timishenko and S. Woinwsky-Krieger), etc.

Figure 10:
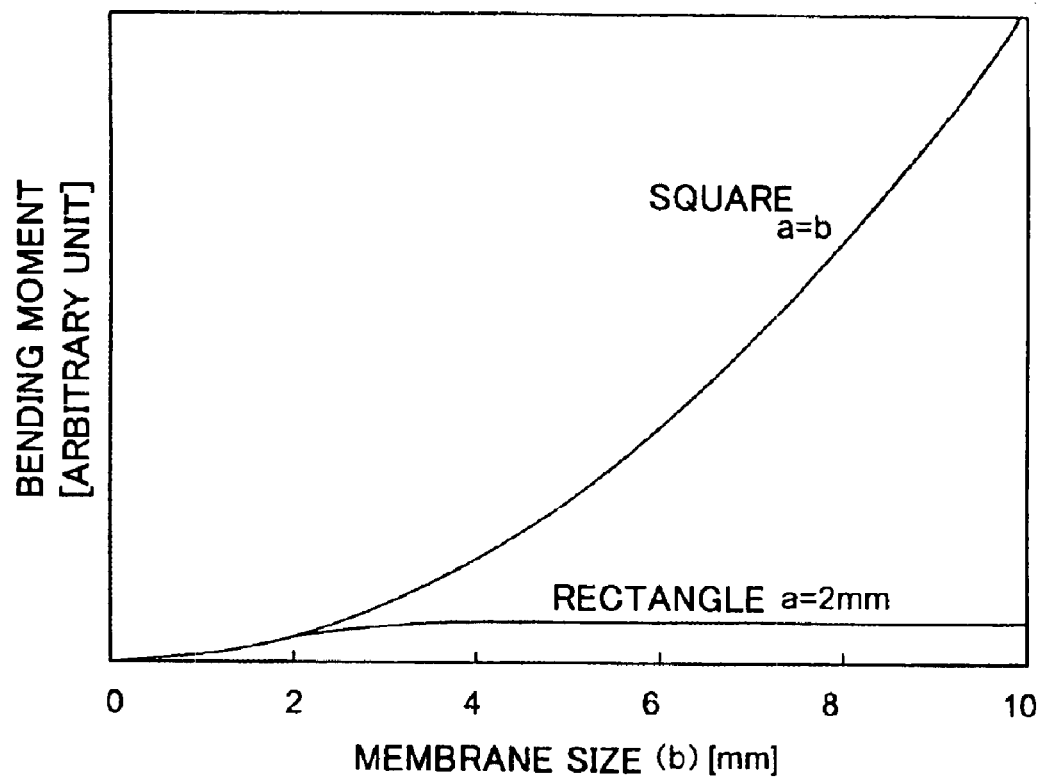
FIG. 10 shows the results of calculation of the relationship between a membrane size and a maximum bending moment of the membrane.

Based on this theory, the maximum bending moment when changing the length b (=a) of a side of a square membrane and the maximum bending moment when fixing the length a of one side to 2 mm and changing the length b of the other side were calculated. The results of the calculation are shown in FIG. 10. As shown in FIG. 10, in the case of a square membrane, the load acting on the membrane rapidly increases along with an increase in the size.

On the other hand, in the case of a rectangular membrane, as long as one side is short, even if the long side is made longer, the load acting on the membrane becomes saturated at a certain value. As explained above, the dynamic strength of a rectangular membrane of a length a of a short side is substantially equal to the dynamic strength of a square membrane of length a of a side. Therefore, according to the mask of the present embodiment, the above first condition is satisfied.

When using the stencil mask of the present embodiment for exposure, regions right below the grid lines cannot be exposed. In FIG. 9A, when superposing the stripes parallel to the y-axis in the sub-regions A and D and the stripes parallel to the x-axis in the sub-regions B and C, M×N blocks are obtained. In the example of FIG. 9A, M=N=8. If linking the M×N blocks with a table of M rows×N columns (=8 rows×8 columns) to summarize which sub-regions are exposed in each block (namely, in which sub-regions patterns can be formed), the result becomes as shown in Table 2.

sub-regions on the same mask. Any device pattern, including donut-like patterns, can be transferred to a wafer due to multiple exposure superposing four sub-regions. Namely, according to the stencil mask of the present embodiment, the above second condition is satisfied.

Figure 11:
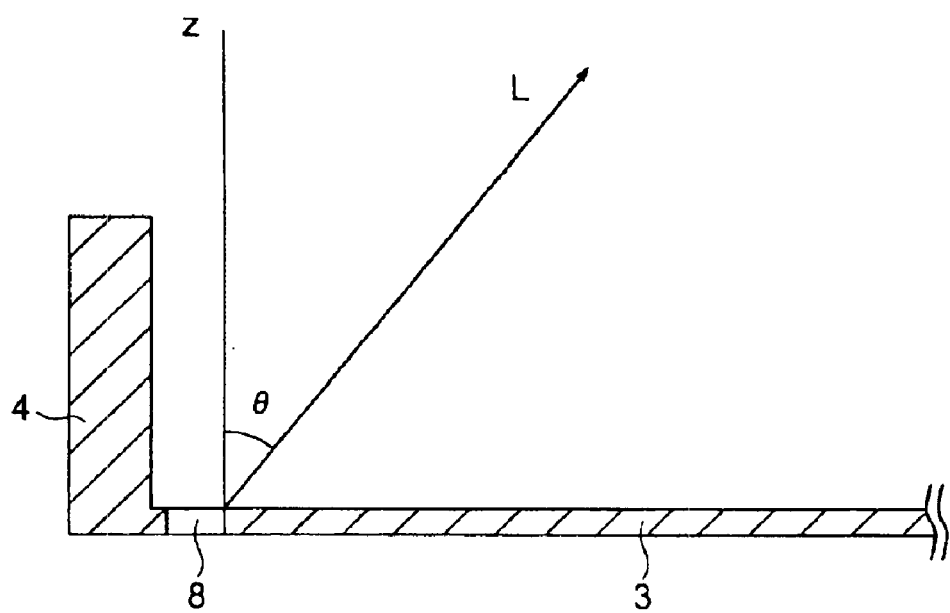
FIG. 11 is a schematic view of alignment using the mask of the present invention.

The direction of the alignment optical system in each sub-region is parallel to the longitudinal direction of the grid lines 4 in the sub-region. Therefore, as shown in the cross-sectional view of FIG. 11, the optical path of the alignment optical system does not interfere with the grid lines 4. FIG. 11 is a cross-sectional view showing a pattern formation region surrounded by the grid lines 4.

As shown in FIG. 11, even if the detection angle θ of the alignment light L measured from the mask normal line direction z becomes larger, according to the arrangement of the optical system shown in FIG. 9, the alignment light L (light reflected from the mask-side alignment mark 8) is not blocked by the grid lines 4. Therefore, it is possible to perform alignment by the TTR system with a high accuracy.

The method of production of a semiconductor device of the present embodiment includes a lithography step using the stencil mask of the present embodiment. In this lithography step, the wafer stage is moved in increments of X or Y shown in FIG. 9 and exposure repeated after every movement. For example, after patterns of the sub-regions A to D are exposed on the wafer by the first exposure, the wafer stage is moved by exactly the length (X) of the sub-region in the x-direction. In this situation, if exposing the patterns of the sub-regions A to D on the wafer by second exposure, the patterns of the sub-region B are exposed at the

| A B | B D | A B | B D | A B | B D | A B | B D |
|-----|-----|-----|-----|-----|-----|-----|-----|
| A C | C D | A C | C D | A C | C D | A C | C D |
| A B | B D | A B | B D | A B | B D | A B | B D |
| A C | C D | A C | C D | A C | C D | A C | C D |
| A B | B D | A B | B D | A B | B D | A B | B D |
| A C | C D | A C | C D | A C | C D | A C | C D |
| A B | B D | A B | B D | A B | B D | A B | B D |
| A C | C D | A C | C D | A C | C D | A C | C D |

According to the grid line arrangement of the stencil mask of the present embodiment, as shown in Table 2, patterns can be formed in two sub-regions in each block. Therefore, two sub-regions can be linked with any position on a chip. Complementarily divided patterns are formed by being allocated to two sub-regions being exposed out of four portion where the patterns of the sub-region A were exposed by the first exposure. Also, the patterns of the sub-region D are exposed at the portion where the patterns of the sub-region C were exposed by the first exposure.

After the second exposure, the wafer stage is moved for example by exactly the length (Y) of the sub-region in the y-direction (Y). In this situation, if exposing the patterns of the sub-regions A to D on the wafer by third exposure, the patterns of the sub-region B are exposed at the portion where the patterns of the sub-region C were exposed by the first exposure and the patterns of the sub-region D were exposed by the second exposure. In this portion, the patterns of the sub-region A are exposed by fourth exposure after moving the wafer further by exactly a length of −X. Namely, all the patterns of the sub-regions A to D are exposed by first to fourth exposure.

In actual production of semiconductor devices, a large number of chips are arranged on a wafer in a matrix. Therefore, instead of moving the wafer stage in the order of X, Y, −X as described above, it is also possible to move the wafer stage in one direction (for example the x-direction) in increments of X from one edge to the other edge, then move the wafer stage in the y-direction by exactly Y and move again the wafer stage in the x-direction in increments of −X from one end to the other end.

The path of movement of the wafer stage can be selected suitably for decreasing the time required for movement of the wafer stage. Note that, if exposing the patterns of the sub-regions A to D each time the wafer is moved, the chips arranged at the outermost positions on the wafer cannot be exposed with the patterns of all of the sub-regions superposed, but are exposed with only the patterns of one or two sub-regions. These chips may be discarded.

As described above, complementarily divided patterns formed in the four sub-regions A to D are exposed multiply. Also, device patterns can be transferred efficiently to the same number of chips as the number of the chip transfer regions Ac included in one sub-region. According to the stencil mask of the present embodiment, the above third condition is satisfied.

Figure 12:
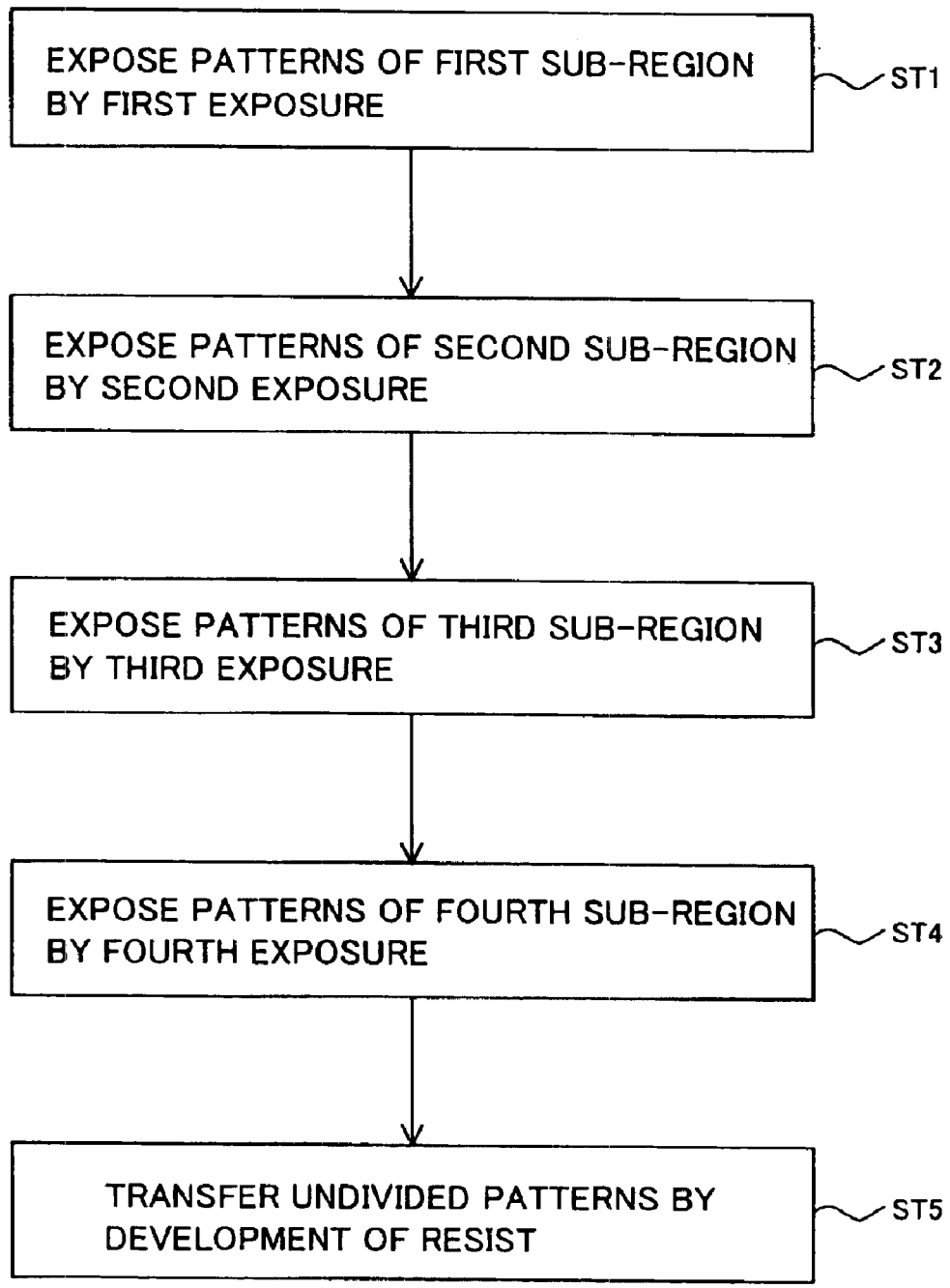
FIG. 12 is a flow chart of a method of production of a semiconductor device of the present invention.

FIG. 12 is a flow chart of the method of production of a semiconductor device of the present embodiment. As shown in FIG. 12, at step 1 (ST1), the patterns of the first sub-region are exposed by first exposure. The first sub-region is made one of the four sub-regions on the mask. Note that the flow chart of FIG. 12 shows the processing performed on a specific position of a resist coated on a wafer. In the first exposure, all the patterns of the first to fourth sub-regions are exposed on the resist comprised of the photosensitive surface on the wafer.

At step 2 (ST2), the patterns of the second sub-region are exposed by second exposure. The second sub-region is made one of the three sub-regions other than the first sub-region. Note that, in the same manner as the first exposure, all the patterns of the first to fourth sub-regions are exposed on the resist on the wafer by the second exposure too.

At step 3 (ST3), the patterns of the third sub-region are exposed by third exposure. The third sub-region is made one of the two sub-regions other than the first and second sub-regions. Note that, in the same manner as the first and second exposure, all the patterns of the first to fourth sub-regions are exposed on the resist on the wafer by the third exposure too.

At step 4 (ST4), the patterns of the fourth sub-region are exposed by fourth exposure. The fourth sub-region is made the remaining sub-region other than the first to third sub-regions. Note that, in the same manner as the first to third exposure, all the patterns of the first to fourth sub-regions are exposed on the resist on the wafer by the fourth exposure, too.

At step 5 (ST5), the resist is developed. Due to this, the pattern before complementary division is restored and transferred on the resist.

According to the method of production of a semiconductor device of the present embodiment, it is possible to efficiently transfer patterns at each sub-region and expose them with a high throughput while suppressing distortion of the mask.

A stripe-shaped membrane is formed on a SCALPEL mask described for example in Japanese Unexamined Patent Publication (Kokai) No. 2000-91227. In this mask, the membrane is made more rectangular for the purpose of decreasing the number of times of making an electron beam or other charged particle exposure beam skip at grid lines when scanning. The direction of the stripes of the membrane is parallel to the scan direction of the charged particle beam.

In the mask of the present embodiment, the membrane is made more rectangular for a different purpose from the mask described in Japanese Unexamined Patent Publication (Kokai) No. 2000-91227. For example, in the mask of the present embodiment, the allowable range of the detection angle of the alignment light fluctuates corresponding to the height of the grid lines. Therefore, the length of the long side of the rectangular membrane is suitably determined accordingly.

As opposed to this, with the SCALPEL mask described in the above publication, such a condition was not considered. Further, the mask region is not divided for forming complementarily divided patterns such as the sub-regions A to D of the mask of the present embodiment.

According to the mask of the present embodiment, the grid lines 4 do not interfere with the alignment light, so the freedom in design of the optical system becomes larger. Therefore, it is also possible to use an optical system having a large numerical aperture (NA) to make the signal intensity higher. In the case of the conventional mask structure formed with the grid lines 11 in a square mesh as shown in FIG. 1, it is necessary to change the optical system or make the membrane larger for preventing the interfere of the alignment light with the grid lines 11.

However, if enlarging the area of the square membrane, as shown in FIG. 10, the mask strength remarkably declines. Further, change of the optical system is also difficult. According to the stencil mask of the present embodiment, change of the optical system is not necessary and the mask strength does not decline.

Figure 13:
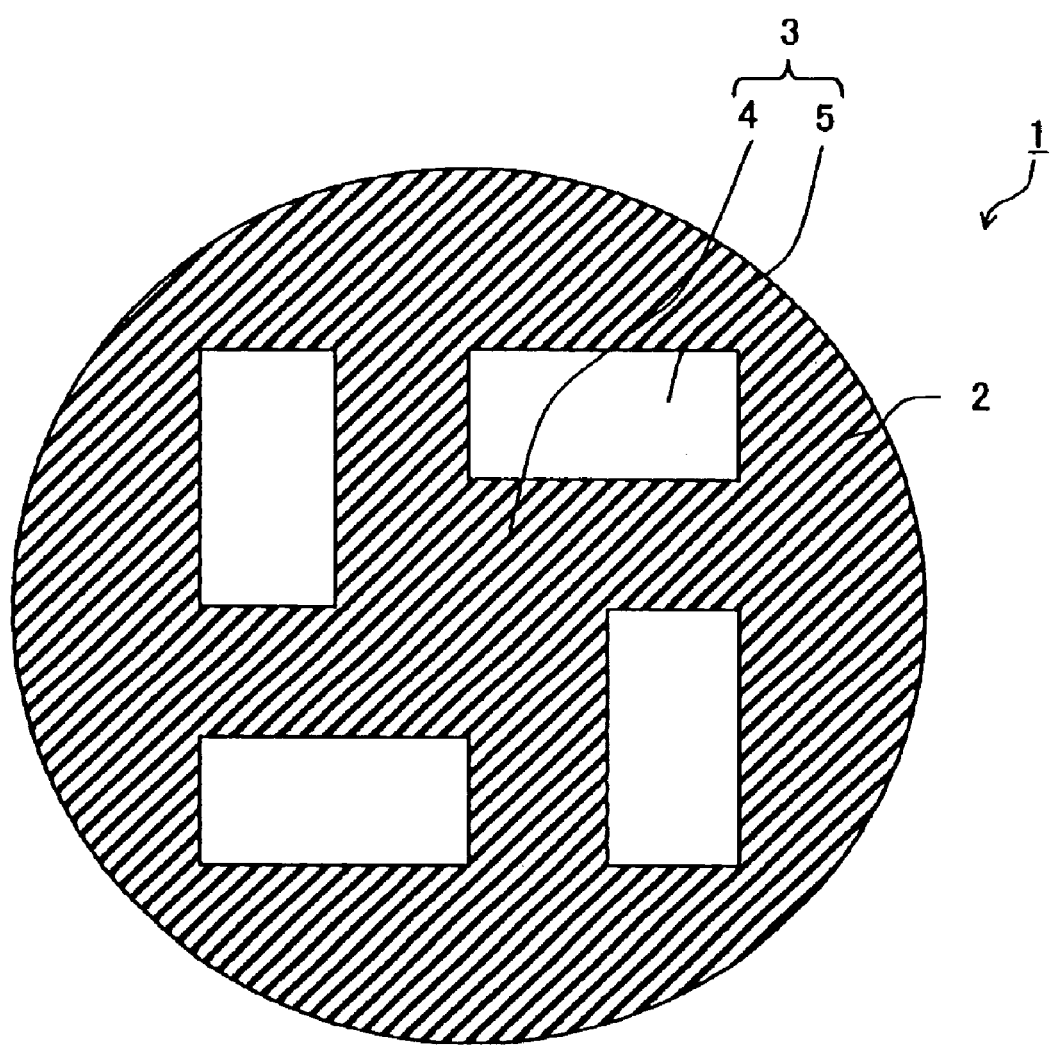
FIG. 13 is a top view of the mask of the present invention.

FIG. 13 is a top view of a mask when there is a single grid line in each sub-region. In the mask 1 of FIG. 13 as well, the membrane 3 is divided into four sub-regions by lines (not shown) perpendicularly crossing at the center of the mask. At an interface portion at which two sub-regions adjoin, a grid line 4 extending along the interface is formed in one sub-region. Due to this, all the grid lines 4 are connected with each other. The number of grid lines formed in each sub-region can be either multiple as shown in FIG. 7 or singular as shown in FIG. 13.

Further, in either case of multiple or singular grid lines in each sub-region, the size of each sub-region need not be the same. In a region where the lines are transferred superposed at the same position of the wafer in all sub-regions, as long as all of the points in the region are included in a pattern formation region in at least two sub-regions, the sizes and shapes of the sub-regions can also be different. However, from the viewpoint of decreasing the distortion of the entire mask, as shown in FIG. 1 or FIG. 13, it is preferable to make the sub-regions the same in size and form grid lines point symmetrically in sub-regions located on the diagonal.

When forming complementarily divided patterns on a plurality of complementary masks and transferring the patterns complementarily by multiple exposure using the complementary masks, it is necessary to exchange the complementary masks mounted in the exposure system. Here, the "complementary masks" mean a plurality of masks formed with different patterns (complementarily divided patterns) comprised of parts of patterns obtained by dividing the pattern of a certain region. By exposing specific regions of the complementary masks superposed at the same place of the exposed object (usually a wafer), the pattern before division is restored and transferred to the exposed object.

As opposed to this, according to the stencil mask of the present embodiment, complementarily divided patterns are formed at different sub-regions of the same mask. Therefore, when exposing the complementarily divided patterns, it is not necessary to exchange the mask mounted in the exposure system and it is possible to perform multiple exposure on chips just by moving the wafer stage. Therefore, compared with the case of forming the complementarily divided patterns on different masks, the throughput of exposure can be greatly improved.

Figure 14:
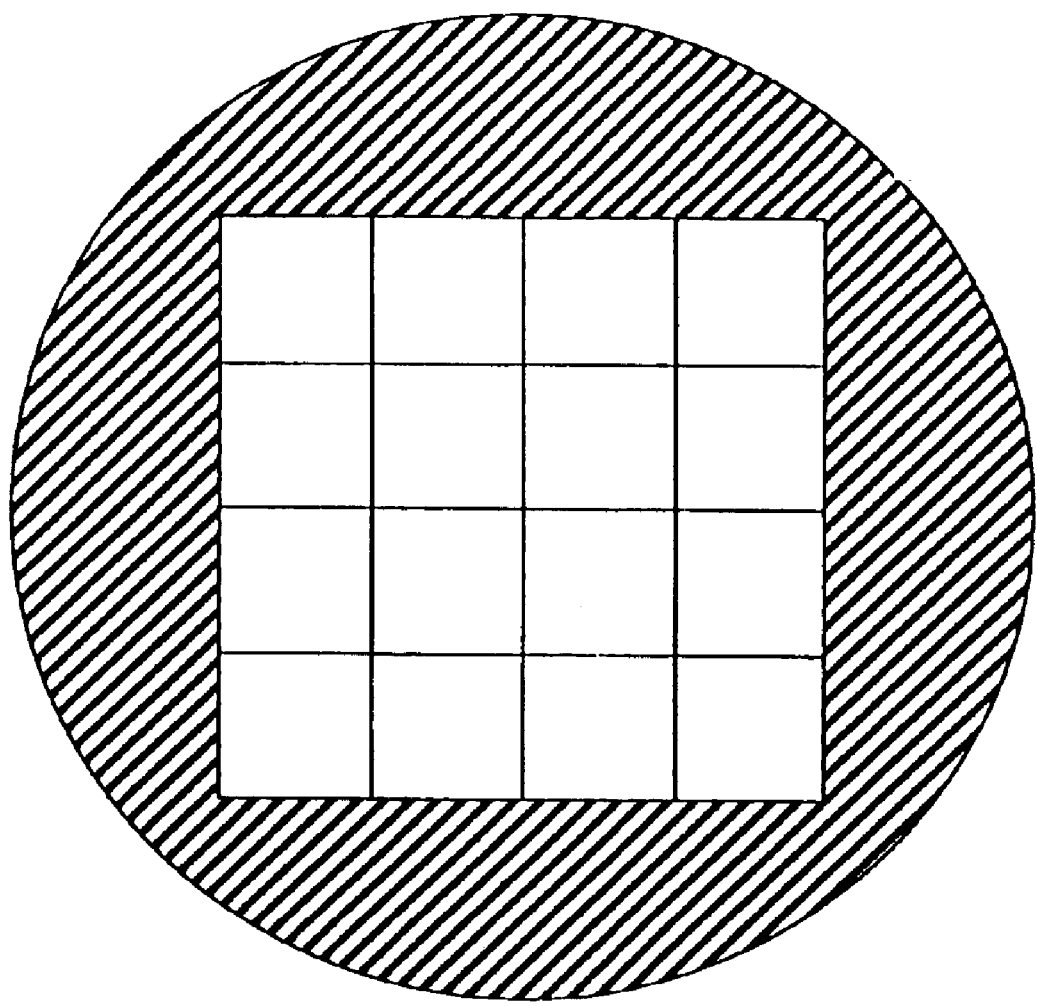
FIG. 14 is a top view of an example of arrangement of sub-regions in the mask of the present invention.
Figure 15:
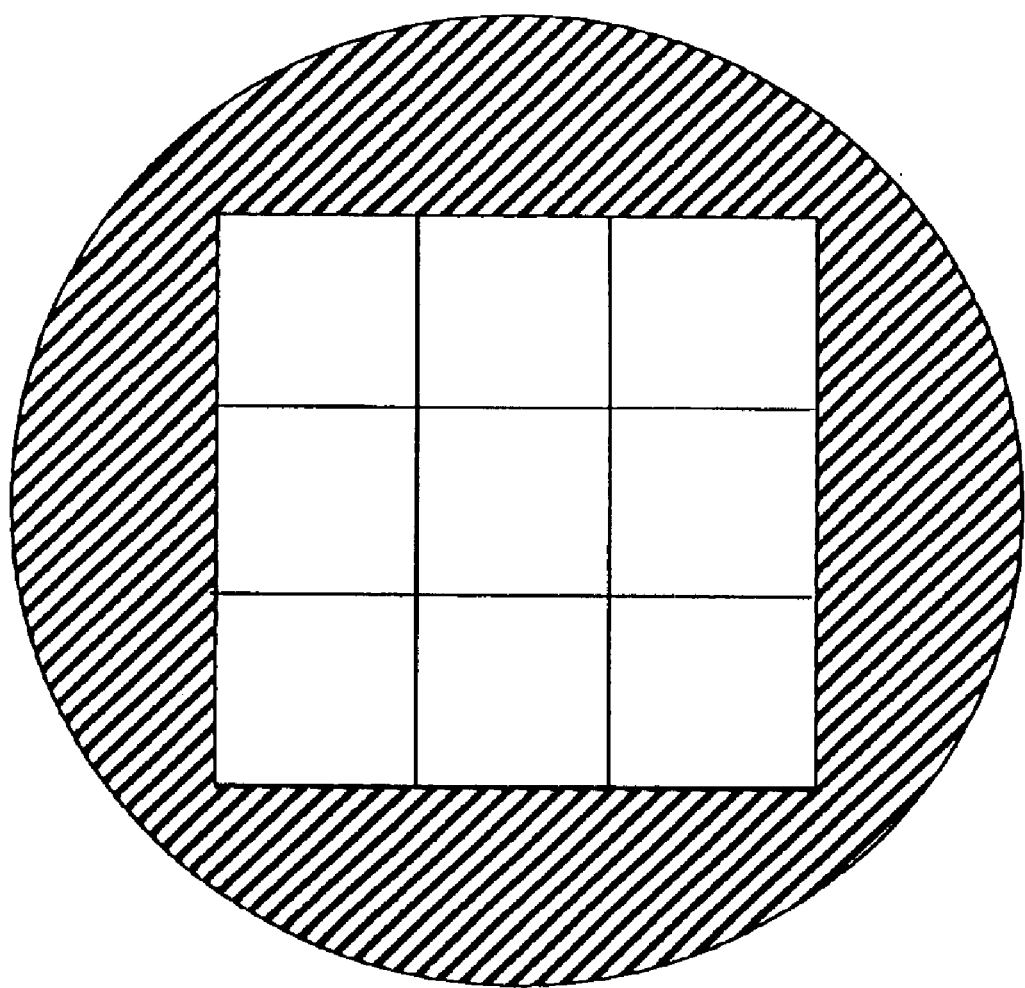
FIG. 15 is a top view of an example of arrangement of sub-regions in the mask of the present invention.
Figure 16:
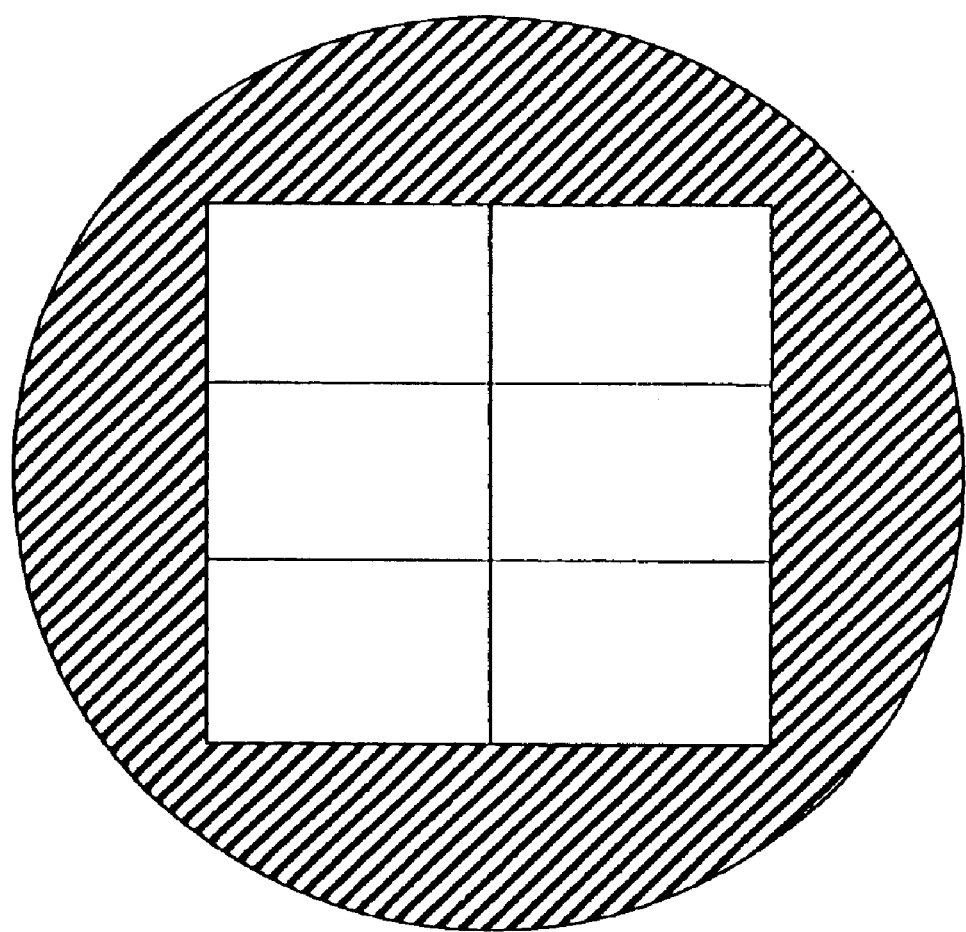
FIG. 16 is a top view of an example of arrangement of sub-regions in the mask of the present invention.

Further, the number of sub-regions formed in the stencil mask of the present embodiment is not limited to four. For example, it is possible to divide the membrane into 16 sub-regions as shown in FIG. 14, divide the membrane into nine sub-regions as shown in FIG. 15, or divide the membrane into six sub-regions as shown in FIG. 16.

When dividing the membrane into other than four sub-regions, the directions in which the grid lines extend are made perpendicular to each other between adjacent sub-regions. When making the number of sub-regions more than four, it is possible to form in the increased number of sub-regions complementarily divided patterns similar to the four sub-regions A to D, form other complementarily divided patterns, or form pattern for exposure other than complementarily divided patterns.

According to the mask and the method of production of a semiconductor device of the present invention, when performing alignment by the TTR system, the alignment light is not blocked by the grid lines. Therefore, even in LEEPL in which the wafer and mask are brought close in proximity, it becomes possible to perform alignment with a high accuracy. Also, according to the method of production of a mask of the embodiment of the present invention, it becomes possible to produce a mask suitable for both alignment by the TTR system and transfer of complementarily divided patterns.

Figure 17:
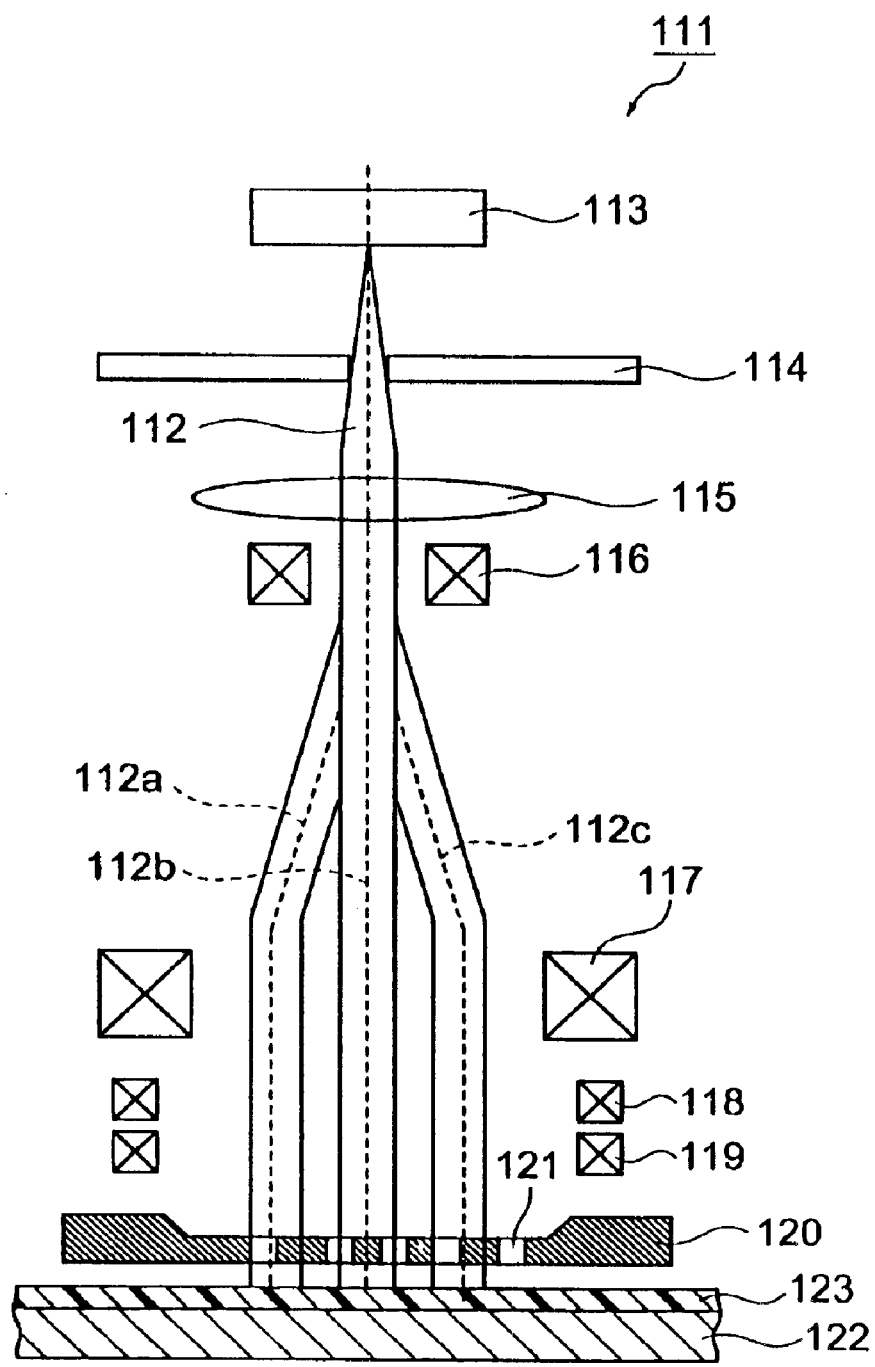
FIG. 17 is a schematic view of an electron beam exposure system to which the mask of the present invention is applied.

FIG. 17 is a schematic view of an exposure apparatus used for LEEPL and shows a projection optical system of an electron beam. The stencil mask of the present embodiment can be suitably used for electron beam exposure by the exposure apparatus as shown in FIG. 17.

The exposure apparatus 111 of FIG. 17 has an electron gun 113 for generating an electron beam 112 and also an aperture 114, condenser lens 115, pair of main deflectors 116 and 117, and pair of fine adjustment deflectors 118 and 119.

The aperture 114 limits the electron beam 112. The condenser lens 115 converts the electron beam 112 into a parallel beam. The sectional shape of the electron beam 112 condensed by the condenser lens 115 is normally a circle, but may be another sectional shape as well. The main deflectors 116 and 117 and the fine adjustment deflectors 118 and 119 are deflector coils. The main deflectors 116 and 117 deflect the electron beam 112 so that the electron beam 112 strikes the surface of the stencil mask 120 basically perpendicularly.

The fine adjustment deflectors 118 and 119 deflect the electron beam 112 so that the electron beam 112 strikes the surface of the stencil mask 120 perpendicularly or inclined slightly from the perpendicular direction. Although the angle of incidence of the electron beam 112 is optimized according to the pattern position on the stencil mask 120 etc., the angle of incidence of the electron beam 112 is about 10 mrad even at the maximum. The electron beam 112 strikes the stencil mask 120 substantially perpendicularly.

The electron beams 112a to 112c shown in FIG. 17 show the state where the electron beam 112 scanning the stencil mask strikes positions on the stencil mask substantially perpendicularly and do not show the state where the electron beams 112a to 112c simultaneously strike the stencil mask 120. The scan by the electron beam 112 may be either of a raster scan or vector scan.

In FIG. 17, the resist 123 on the wafer 122 is exposed by the electron beam passing through the hole 121 parts of the stencil mask 120. For LEEPL, equal magnification masks are used. The stencil mask 120 and wafer 122 are arranged in proximity.

At that time of electron beam exposure by the above-mentioned exposure system 111, the stencil mask of the present embodiment is used as the stencil mask 120. In the stencil mask according to the present embodiment, the membrane is reinforced by the grid lines so flexing of the membrane is prevented and positional deviation of transfer patterns in the electron beam exposure is reduced. Also, complementarily divided patterns can be exposed with superposition without changing the stencil mask 120 due to moving the wafer.

Figure 18:
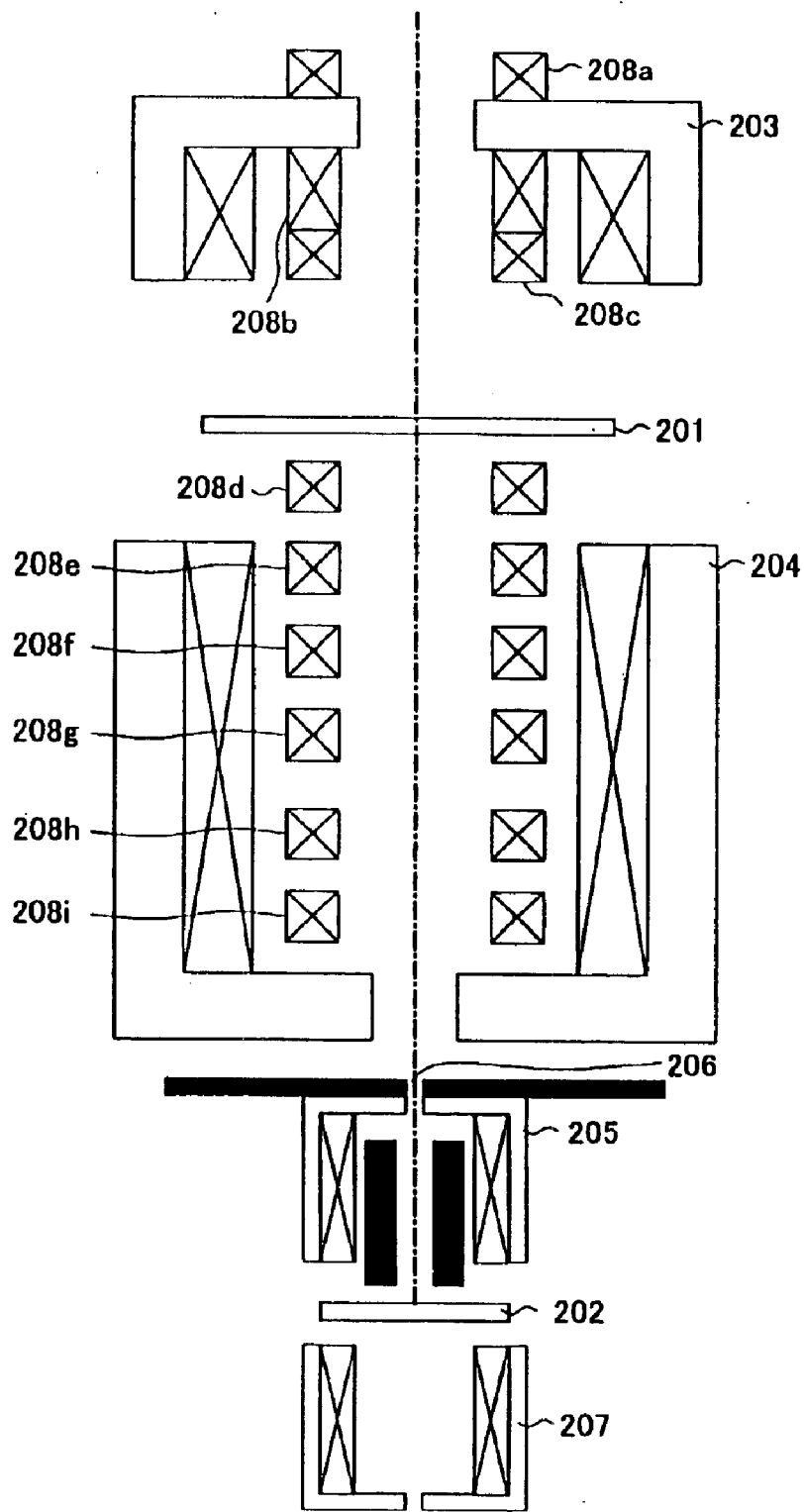
FIG. 18 is a schematic view of another electron beam exposure system to which the mask of the present invention is applied.

The stencil mask having an arrangement of grid lines shown in the above embodiment can also be applied to other electron beam exposure systems other than LEEPL, for example an electron beam exposure system shown in FIG. 18. According to the projection optical system shown in FIG. 18, the patterns of the mask 201 are transferred reduced by a predetermined magnification to a wafer or other sample 202 etc., using an electron beam. The path of the electron beam is controlled by a condenser lens 203, first projection lens 204, second projection lens 205, crossover aperture 206, sample lens 207, and a plurality of deflectors 208a to 208i.

In the projection optical system shown in FIG. 18, a deflection magnetic field is generated from the plurality of deflectors 208 so that the electron beam passing through the mask 201 passes through the crossover aperture 206 and perpendicularly strikes the sample 202. The mask of the present embodiment can also be used for other exposure systems using an ion beam or other charged particle beam in addition to the electron beam exposure system having the above projection optical system. Further, the mask of the present embodiment can also be used for exposure systems using X-rays, radiation, or light rays.

The embodiments of the mask, the method of production of a mask, and the method of production of a semiconductor device of the present invention are not limited to the above explanation. For example, it is sufficient that the grid lines of the mask be formed in stripe shapes—the material and configuration of the mask can be suitably modified. Specifically, the membrane can be provided with an electroconductive layer for preventing charge up or the mask can be fabricated by another method than the above. The stencil mask of the present embodiment can also be used for another process of production of a semiconductor device than lithography, for example ion implantation. In addition, various modifications can be made within a scope not exceeding the gist of the present invention.

According to the mask of the present invention, alignment by the TTR system and transfer of complementarily divided patterns are possible and a sufficient membrane strength can be obtained.

According to the method of production of a mask of the present invention, alignment by the TTR system and transfer of complementarily divided patterns are possible and a mask having a sufficient membrane strength can be produced.

According to a method of production of a semiconductor device of the present invention, the accuracy of alignment in the lithography step is improved and it becomes possible to transfer fine patterns with a high accuracy.

What is claimed is:

1. A mask comprising:
   a support frame;
   a thin film formed thinner than said support frame and surrounded by said support frame;
   a first sub-region of a plurality of sub-regions obtained by dividing said thin film by a plurality of lines including a first line passing through a reference point consisting of one point on said thin film and extending in a first direction and a second line orthogonal to the first line at the reference point and extending in a second direction;
   a second sub-region adjacent to said first sub-region in the first direction;
   a third sub-region adjacent to said first sub-region in the second direction;
   a fourth sub-region adjacent to said second sub-region in the second direction and adjacent to said third sub-region in the first direction;
   a first group of grid lines comprised of at least one grid line extending on said first sub-region in the second direction and having one end connected to one of a third group of grid lines to reinforce said thin film, said first group of grid lines including a grid line contacting the second line;
   a second group of grid lines comprised of at least one grid line extending on said second sub-region in the first direction and having one end connected to one of said first group of grid lines to reinforce said thin film, said second group of grid lines including a grid line contacting the first line;
   said third group of grid lines comprised of at least one grid line extending on said third sub-region in the first direction and having one end connected to one of a fourth group of grid lines to reinforce said thin film, said third group of grid lines including a grid line contacting the first line;
   said fourth group of grid lines comprised of at least one grid line extending on said fourth sub-region in the second direction and having one end connected to one of said second group of grid lines to reinforce said thin film, said fourth group of grid lines including a grid line contacting the second line;
   a first aperture formed at a portion that is not located at the grid lines in the first sub-region; and
   a second aperture formed at a portion that is not located at the grid lines in at least one sub-region of the second to fourth sub-regions, wherein the first to fourth sub-regions are divided into a plurality of chip transfer regions the same in shape and size by at least one first division line parallel to the first line and at least one second division line parallel to the second line.

2. A mask as set forth in claim 1, wherein the first aperture and the second aperture form patterns complementarily.

3. A mask as set forth in claim 1, wherein the grid lines are formed at equal intervals in each of the first to fourth sub-regions.

4. A mask as set forth in claim 3, wherein a space between the grid lines of the third group is equal to the space between the grid lines of the second group.

5. A mask as set forth in claim 4, wherein a space between the grid lines of the fourth group is same as a space between the grid lines of the first group.

6. A mask as set forth in claim 1, wherein the first to fourth sub-regions are squares or rectangles the same as each other in shape and size.

7. A mask as set forth in claim 1, wherein the grid lines of at least one of group among the first to fourth groups are formed to having other ends connected to the support frame.

8. A mask as set forth in claim 1, wherein the first and second apertures are holes through which a charged particle beam passes.

9. A mask comprising:
   a support frame;
   a thin film formed thinner than said support frame and surrounded by said support frame;
   a first sub-region of a plurality of sub-regions obtained by dividing said thin film by a plurality of lines including a first line passing through a reference point consisting of one point on said thin film and extending in a first direction and a second line orthogonal to the first line at the reference point and extending in a second direction;
   a second sub-region adjacent to said first sub-region in the first direction;
   a third sub-region adjacent to said first sub-region in the second direction;
   a fourth sub-region adjacent to said second sub-region in the second direction and adjacent to said third sub-region in the first direction;

a first group of grid lines comprised of at least one grid line extending on said first sub-region in the second direction and having one end connected to one of a third group of grid lines to reinforce said thin film, said first group of grid lines including a grid line contacting the second line;

a second group of grid lines comprised of at least one grid line extending on said second sub-region in the first direction and having one end connected to one of said first group of grid lines to reinforce said thin film, said second group of grid lines including a grid line contacting the first line;

said third group of grid lines comprised of at least one grid line extending on said third sub-region in the first direction and having one end connected to one of a fourth group of grid lines to reinforce said thin film, said third group of grid lines including a grid line contacting the first line;

said fourth group of grid lines comprised of at least one grid line extending on said fourth sub-region in the second direction and having one end connected to one of said second group of grid lines to reinforce said thin film, said fourth group of grid lines including a grid line contacting the second line;

a first aperture formed at a portion that is not located at the grid lines in the first sub-region; and a second aperture formed at a portion that is not located at the grid lines in at least one sub-region of the second to fourth sub-regions comprising an alignment mark formed at a portion that is not located at the grid lines in the first to fourth sub-regions.

10. A mask as set forth in claim 9, wherein the alignment mark is formed at a furthest part from the reference point in each sub-region.

11. A method of production of a semiconductor device comprising an exposure step of irradiating a charged particle beam, radiation, or a light ray on a photosensitive surface via a mask, comprising:

a first exposure step of irradiating a charged particle beam, radiation, or a light ray on a photosensitive surface via a mask comprising:

a support frame, a thin film made formed thinner than said support frame and surrounded by said support frame, a first sub-region of a plurality of sub-regions obtained by dividing said thin film by a plurality of lines including a first line passing through a reference point consisting of one point on said thin film and extending in a first direction and a second line orthogonal to the first line at the reference point and extending in a second direction, a second sub-region adjacent to said first sub-region in the first direction, a third sub-region adjacent to said first sub-region in the second direction, a fourth sub-region adjacent to said second sub-region in the second direction and adjacent to said third sub-region in the first direction, a first group of grid lines comprised of at least one grid line extending on said first sub-region in a second direction and having one end connected to one of a third group of grid lines to reinforce said thin film, said first group of grid lines including a grid line contacting the second line, a second group of grid lines comprised of at least one grid line extending on said second sub-region in a first direction and having one end connected to one of said first group of grid lines to reinforce said thin film, said second group of grid lines including a grid line contacting the first line, said third group of grid lines comprised of at least one grid line extending on said third sub-region in the first direction and having one end connected to one of a fourth group of grid lines to reinforce said thin film, said third group of grid lines including a grid line contacting the first line, said fourth group of grid lines comprised of at least one grid line extending on said fourth sub-region in a second direction and having one end connected to one of said second group of grid lines to reinforce said thin film, said fourth group of grid lines including a grid line contacting the second line, a first aperture formed at a portion that is not located at the grid lines in the first sub-region, and a second aperture formed at a portion that is not located at the grid lines in at least one sub-region of the second to fourth sub-regions, said first exposure step conducting the first exposure superposing the first sub-region at a predetermined position of the photosensitive surface to transfer the first aperture in the predetermined position, and a second exposure step of performing second exposure superposing one of the sub-regions including the second aperture to a predetermined position to transfer the second aperture in the predetermined position.

12. A method of production of a semiconductor device as set forth in claim 11, further comprising:

a third exposure step of performing third exposure superposing a sub-region, not superposed at said predetermined position in said first and second exposures and having a third aperture, at said predetermined position to transfer the third aperture in said predetermined position and a fourth exposure step of performing fourth exposure superposing a sub-region not superposed at said predetermined position in said first to third exposures and having a fourth aperture, at said predetermined position to transfer the fourth aperture in said predetermined position.

13. A method of production of a semiconductor device as set forth in claim 12, wherein:

said mask comprises a mask-side alignment mark at a portion that is not located at the grid lines in the first to fourth sub-regions and said method further comprising:

before said first exposure step, forming in advance a wafer-side alignment mark detectable via the mask on said photosensitive surface or beneath said photosensitive surface and comprising, before each exposure step, at least one of the steps of:

irradiating light in the first direction to a sub-region including said grid lines extending in the first direction so as to detect positions of light reflected from the mask-side alignment mark and light reflected from the photosensitive surface-side alignment mark to align the mask and the photosensitive surface and irradiating light in the second direction to a sub-region including said grid lines extending in the second direction so as to detect positions of light reflected from the mask-side alignment mark and light reflected from the photosensitive surface-side alignment mark to align the mask and the photosensitive surface.

14. A method of production of a semiconductor device as set forth in claim 11, wherein:

said mask comprises a mask-side alignment mark at a portion that is not located at the grid lines in the first to fourth sub-regions and said method further comprising:

before said first exposure step, forming in advance a wafer-side alignment mark detectable via the mask on said photosensitive surface or beneath said photosensitive surface and comprising, before each exposure step, at least one of the steps of:

irradiating light in the first direction to a sub-region including said grid lines extending in the first direction so as to detect positions of light reflected from the mask-side alignment mark and light reflected from the photosensitive surface-side alignment mark to align the mask and the photosensitive surface and irradiating light in the second direction to a sub-region including said grid lines extending in the second direction so as to detect positions of light reflected from the mask-side alignment mark and light reflected from the photosensitive surface-side alignment mark to align the mask and the photosensitive surface.

15. A method of production of a semiconductor device as set forth in claim 11, wherein the alignment mark is formed at a furthest part from the reference point in each sub-region.

16. A method of production of a semiconductor device as set forth in claim 11, wherein the alignment is conducted concurrently with the exposure.

* * * * *